United States Patent
Choi et al.

(10) Patent No.: US 10,490,759 B2
(45) Date of Patent: Nov. 26, 2019

(54) DISPLAY DEVICE

(71) Applicant: Samsung Display Co., Ltd., Yongin-si, Gyeonggi-do (KR)

(72) Inventors: Hayoung Choi, Cheonan-si (KR); Kyeongyeol Heo, Cheonan-si (KR); Joonsam Kim, Hwaseong-si (KR); Jihong Hwang, Pyeongtaek-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/403,268

(22) Filed: May 3, 2019

(65) Prior Publication Data

US 2019/0259968 A1    Aug. 22, 2019

Related U.S. Application Data

(63) Continuation of application No. 15/709,943, filed on Sep. 20, 2017, now Pat. No. 10,333,087.

(30) Foreign Application Priority Data

Sep. 22, 2016    (KR) .......................... 10-2016-0121532

(51) Int. Cl.
    *H01L 51/52*    (2006.01)
    *H01L 51/00*    (2006.01)
    *H01L 27/32*    (2006.01)

(52) U.S. Cl.
    CPC ...... *H01L 51/0097* (2013.01); *H01L 27/3276* (2013.01); *H01L 51/5253* (2013.01); *H01L 51/5256* (2013.01); *H01L 27/3244* (2013.01); *H01L 51/5246* (2013.01); *H01L 2251/5338* (2013.01); *Y02E 10/549* (2013.01)

(58) Field of Classification Search
    CPC ............. H01L 51/0097; H01L 27/3276; H01L 51/5253; H01L 51/5256; H01L 51/5246; H01L 2251/5338; H01L 27/3244
    See application file for complete search history.

(56) References Cited

U.S. PATENT DOCUMENTS

| | | |
|---|---|---|
| 9,229,563 B2 | 1/2016 | Park |
| 9,293,485 B2 | 3/2016 | Youn et al. |
| 9,356,087 B1 | 5/2016 | Lee et al. |
| 2013/0169515 A1 | 7/2013 | Prushinskiy et al. |

(Continued)

FOREIGN PATENT DOCUMENTS

| | | |
|---|---|---|
| KR | 10-2014-0122960 A | 10/2014 |
| KR | 10-2015-0009291 A | 1/2015 |

(Continued)

OTHER PUBLICATIONS

EPO Extended Search Report dated Jan. 26, 2018, for corresponding European Patent Application No. 17192749.4 (10 pages).

*Primary Examiner* — Kyoung Lee
(74) *Attorney, Agent, or Firm* — Lewis Roca Rothgerber Christie LLP

(57) ABSTRACT

A display device includes a substrate having a planar area, a bending area extending from the planar area, and a surrounding area extending from the bending area, a first protective layer at a boundary portion of the bending area, and a second protective layer covering an entire surface of the bending area and covering the first protective layer.

20 Claims, 6 Drawing Sheets

(56) References Cited

U.S. PATENT DOCUMENTS

| | | | |
|---|---|---|---|
| 2014/0049449 A1* | 2/2014 | Park | G09G 5/00 |
| | | | 345/1.3 |
| 2014/0306941 A1 | 10/2014 | Kim et al. | |
| 2015/0048349 A1 | 2/2015 | Kawata et al. | |
| 2016/0117041 A1 | 4/2016 | Lee et al. | |
| 2016/0268542 A1 | 9/2016 | Suzuki | |

FOREIGN PATENT DOCUMENTS

| | | |
|---|---|---|
| KR | 10-2016-0008307 A | 1/2016 |
| KR | 10-2016-0050146 A | 5/2016 |
| WO | WO 2016/093476 A1 | 6/2016 |

\* cited by examiner

DISPLAY DEVICE

CROSS-REFERENCE TO RELATED APPLICATION

This application is a continuation of U.S. patent application Ser. No. 15/709,943, filed Sep. 20, 2017, which claims priority to and the benefit of Korean Patent Application No. 10-2016-0121532, filed on Sep. 22, 2016, in the Korean Intellectual Property Office (KIPO), the disclosure of which is incorporated by reference herein in its entirety.

BACKGROUND

1. Field

Aspects of the present invention relate to a display device.

2. Discussion of Related Art

Display devices may be classified into liquid crystal display ("LCD") devices, organic light emitting diode ("OLED") display devices, plasma display panel ("PDP") devices, electrophoretic display devices and the like based on a light emitting scheme thereof.

Flexible display devices capable of being bent are being developed. Such a flexible display device may be used in various fields because it may be used in a folded or curved shape. In the flexible display device, display elements are disposed on a flexible substrate.

The flexible display device may realize a narrow bezel by bending at least one side end portion of the display device. In such an exemplary embodiment, cracks may occur in a metal wiring in the bending area.

Accordingly, a protective layer may be formed in the bending area so as to substantially prevent or reduce breakage of the metal wiring. However, the protective layer may contact a driving circuit element or a polarizer in a display area, thus resulting in degradation of the display quality of the display device.

It is to be understood that this background of the technology section is intended to provide useful background for understanding the technology and as disclosed herein, the technology background section may include ideas, concepts, or recognitions that were not part of what was known or appreciated by those skilled in the pertinent art prior to a corresponding effective filing date of subject matter disclosed herein.

SUMMARY

Aspects of embodiments of the present invention are directed to a display device with improved display quality.

According to an exemplary embodiment of the present invention, there is provided a display device including: a substrate having a planar area, a bending area extending from the planar area, and a surrounding area extending from the bending area; a first protective layer at a boundary portion of the bending area; and a second protective layer covering an entire surface of the bending area and covering the first protective layer.

In some embodiments, the first protective layer and the second protective layer are at at least a part of the planar area.

In some embodiments, the first protective layer and the second protective layer are at at least a part of the surrounding area.

In some embodiments, the first protective layer and the second protective layer include a photo-curable resin.

In some embodiments, the first protective layer has a width of 500 μm to 800 μm.

In some embodiments, the first protective layer has a thickness of 30 μm to 70 μm.

In some embodiments, the first protective layer and the second protective layer have a thickness of 70 μm to 130 μm at an overlap area between the first protective layer and the second protective layer.

In some embodiments, the first protective layer surrounds a central portion of the bending area.

In some embodiments, the display device further includes: a gate line on the substrate and at the planar area; a data line crossing the gate line; and a thin film transistor connected to the gate line and the data line.

In some embodiments, the display device further includes a driving integrated circuit on the substrate and at the surrounding area.

In some embodiments, the display device further includes a support film on a rear surface of the substrate.

In some embodiments, the support film includes a polyethyleneterephthalate (PET) film.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

Figure 1:
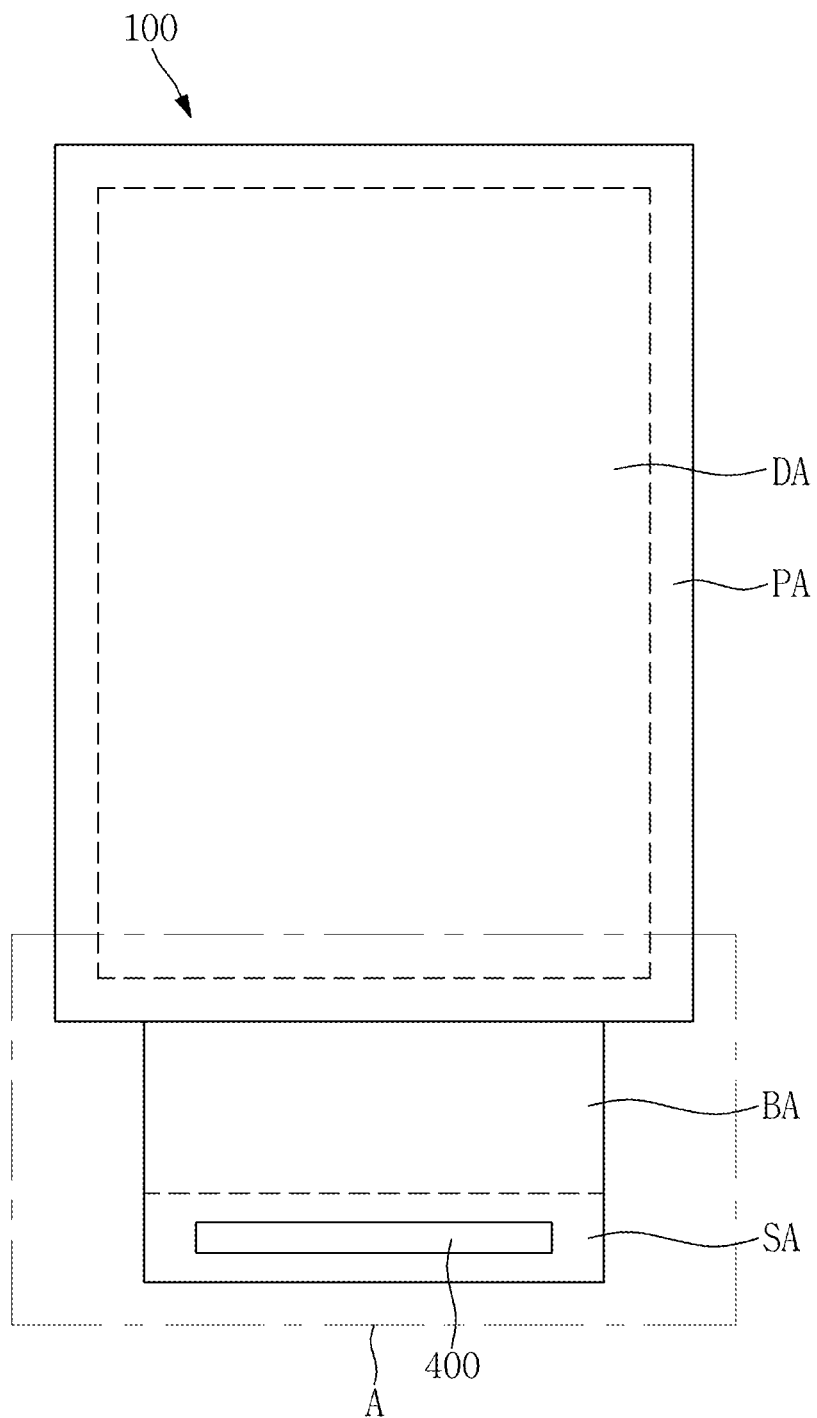
FIG. 1 is a plan view illustrating a display device according to an exemplary embodiment of the present invention.

Exemplary embodiments will now be described more fully hereinafter with reference to the accompanying drawings. Although the invention may be modified in various suitable manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas may be illustrated in an enlarged manner for clarity and ease of description thereof.

The terminology used herein is for the purpose of describing particular embodiments and is not intended to be limiting of the inventive concept. As used herein, the singular forms "a" and "an" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

As used herein, the terms "use," "using," and "used" may be considered synonymous with the terms "utilize," "utilizing," and "utilized," respectively.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention and like reference numerals refer to like elements throughout the specification.

Hereinafter, an exemplary embodiment will be described with reference to FIGS. 1, 2, 3 and 4. The display device according to an exemplary embodiment is assumed to be an organic light emitting diode ("OLED") display device. However, the scope of exemplary embodiments are not limited to the OLED display device. For example, the present invention may be applied to a liquid crystal display ("LCD") device.

Figure 2:
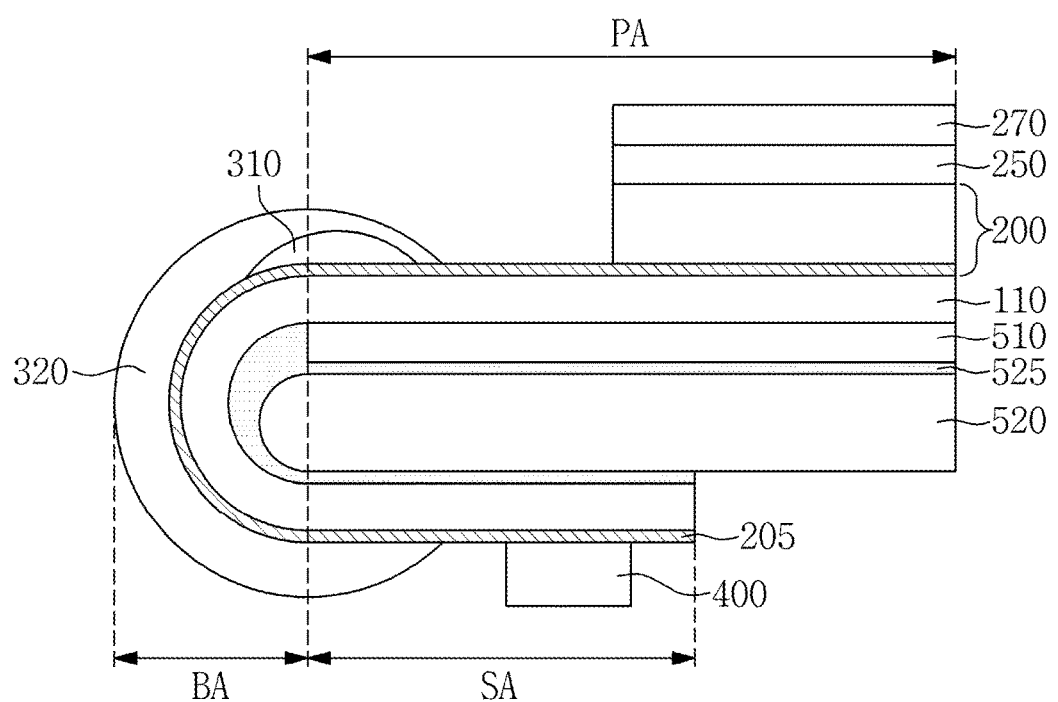
FIG. 2 is a cross-sectional view illustrating a display device in a folded state according to an exemplary embodiment of the present invention.

FIG. 1 is a plan view illustrating a display device according to an exemplary embodiment of the present invention. FIG. 2 is a cross-sectional view illustrating a display device in a folded state according to an exemplary embodiment of the present invention.

Referring to FIGS. 1 and 2, a display device 100 according to an exemplary embodiment includes a substrate 110, a driving circuit unit 200, an encapsulation layer 250, a polarizer 270, a first protective layer 310, a second protective layer 320, and a driving integrated circuit ("IC") 400.

The substrate 110 includes a planar area PA including a display area DA, a bending area BA extending from the planar area PA, and a surrounding area SA extending from the bending area BA. The substrate 110 according to an exemplary embodiment is bent at the bending area BA such that the surrounding area SA on which the driving IC 400 is disposed may be positioned on a rear surface of the planar area PA. Accordingly, a width of a side bezel may be reduced and thus the display device 100 of a narrow bezel may be provided.

In addition, it is described that, as illustrated in FIG. 1, the bending area BA according to an exemplary embodiment is positioned on a lower side of the planar area PA. However, exemplary embodiments are not limited thereto, and the bending area BA may be positioned on a left side, a right side or an upper side of the planar area PA. In addition, although the substrate 110 is depicted as having a constant thickness, exemplary embodiments are not limited thereto. The substrate 110 may have less thickness in the bending area BA than in the planar area PA.

The substrate 110 may include a plastic material having flexibility. For example, the substrate 110 may include one selected from the group consisting of: kapton, polyethersulphone (PES), polycarbonate (PC), polyimide (PI), polyethyleneterephthalate (PET), polyethylenenaphthalate (PEN), polyacrylate (PAR) and fiber reinforced plastic (FRP).

The driving circuit unit 200, the encapsulation layer 250 and the polarizer 270 may be disposed on the substrate 110 and at the planar area PA. The driving circuit unit 200 includes a gate line 151, a data line 171 crossing the gate line 151, thin film transistors 10 and 20 connected to the gate line 151 and the data line 171, and an organic light emitting diode ("OLED") 210, which are to be described below. That is, the OLED 210 emits light according to a driving signal received through the gate line 151, the data line 171, and the thin film transistors 10 and 20 to display an image, which will be described in detail below.

The encapsulation layer 250 is disposed on the driving circuit unit 200. The encapsulation layer 250 substantially prevents outside air such as moisture or oxygen from penetrating into the driving circuit unit 200. In addition, a barrier film for protecting the driving circuit unit 200 may be further stacked on the encapsulation layer 250.

The polarizer 270 is disposed on the encapsulation layer 250. The polarizer 270 may be disposed at the planar area PA to compensate for the optical characteristics of the display device 100. For example, the polarizer 270 may allow only specific polarized light to pass through among light arriving from the outside and absorb or block the other light. In addition, the polarizer 270 may substantially prevent or reduce reflection of external light.

The signal wiring 205 is disposed on the substrate 110 and at the bending area BA. The signal wiring 205 may electrically connect the display area DA of the planar area PA and the driving IC 400 of the surrounding area SA. Accordingly, the signal wiring 205 is formed so as to extend to the display area DA of the planar area PA and the surrounding area SA.

The signal wiring 205 may include the same or substantially the same material as the material included in gate electrodes 152 and 155 to be described below. In addition, the signal wiring 205 may include the same or substantially the same material as the material included in source electrodes 173 and 176, drain electrodes 174 and 177, or a pixel electrode 211 to be described below. In addition, the signal wiring 205 may include an additional metal material. It is preferable that the signal wiring 205 include a flexible metal material in order to reduce or substantially minimize damage during bending of the substrate 110. For example, the signal wiring 205 may include copper (Cu), a copper alloy, and/or the like.

First and second protective layers 310 and 320 are disposed on the signal wiring 205 in order to substantially prevent or reduce breakage and moisture permeation of the signal wiring 205 during bending. That is, the first and second protective layers 310 and 320 may be disposed on the signal wiring 205 in the bending area BA. The first and second protective layers 310 and 320 may include a material that may reduce or substantially minimize force applied to the signal wiring 205 in the bending area BA. In such an exemplary embodiment, a thickness, a Young's modulus, and the like of the first and second protective layers 310 and 320 may be considered.

The driving IC 400 is mounted on the substrate 110 and at the surrounding area SA. The driving IC 400 according to an exemplary embodiment is a component mounted with a circuit chip or the like and receives a driving signal from an external or separate printed circuit board (PCB). The driving IC 400 may convert the input driving signal and supply the converted driving signal to the display area DA of the planar area PA through the signal wiring 205. The driving IC 400 according to an exemplary embodiment is described as being mounted on the substrate 110; however, exemplary embodiments are not limited thereto. In an exemplary embodiment, the driving IC 400 may be mounted on a separate PCB, FPCB, or the like.

The display device 100 according to an exemplary embodiment may further include a support film 510, an auxiliary member 520, and an adhesive layer 525 on a rear surface of the substrate 110.

The support film 510 may be positioned on the rear surface of the substrate 110, and may be positioned only at a portion corresponding to the planar area PA of the substrate 110. Accordingly, bending of the substrate 110 in the planar area PA may be substantially prevented or reduced at the time of bending. For example, the support film 510 may be a PET film exhibiting excellent (e.g., high) strength and heat resistance.

The substrate 110, which is bent, is attached using the auxiliary member 520 and the adhesive layer 525. One side surface of the auxiliary member 520 may have a circular shape. Accordingly, the substrate 110 may be bent with a preset or predetermined radius along the circular auxiliary member 520 in the bending area BA.

The adhesive layer 525 may be a liquid adhesive. For example, after the auxiliary member 520 is disposed on the substrate 110 to which the liquid adhesive is applied, the bent substrate 110 and the auxiliary member 520 may be attached to each other by curing the liquid adhesive. In some embodiments, the adhesive layer 525 may be a double-sided tape. The adhesive layer 525 may include an acrylic resin, an epoxy resin, a fluoro-resin, a teflon resin, and/or the like.

The display device 100 according to an exemplary embodiment may reduce a bezel width by locating the surrounding area SA on which the driver IC 400 is disposed on the rear surface of the planar area PA.

Figure 3:
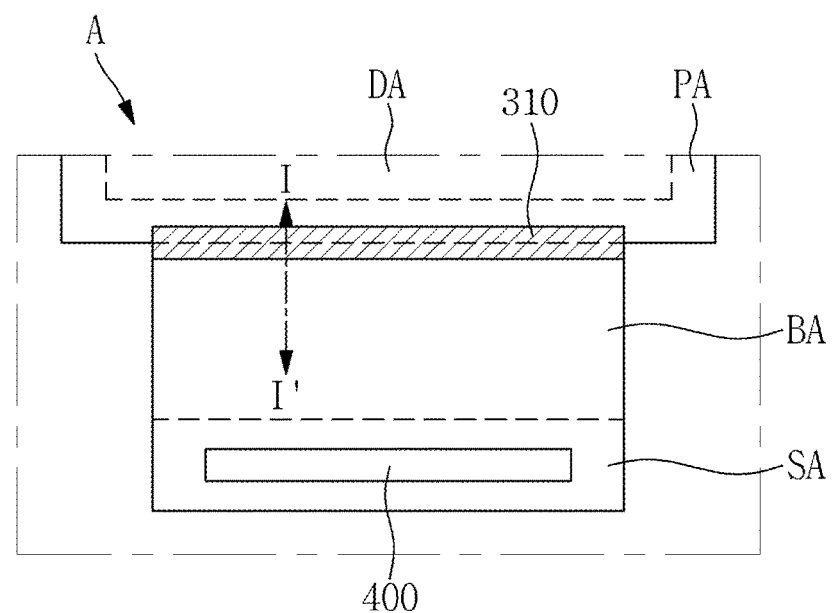
FIG. 3 is a partial enlarged view illustrating a substrate and a first protective layer in the area "A" of FIG. 1 according to an exemplary embodiment of the present invention.
Figure 4:
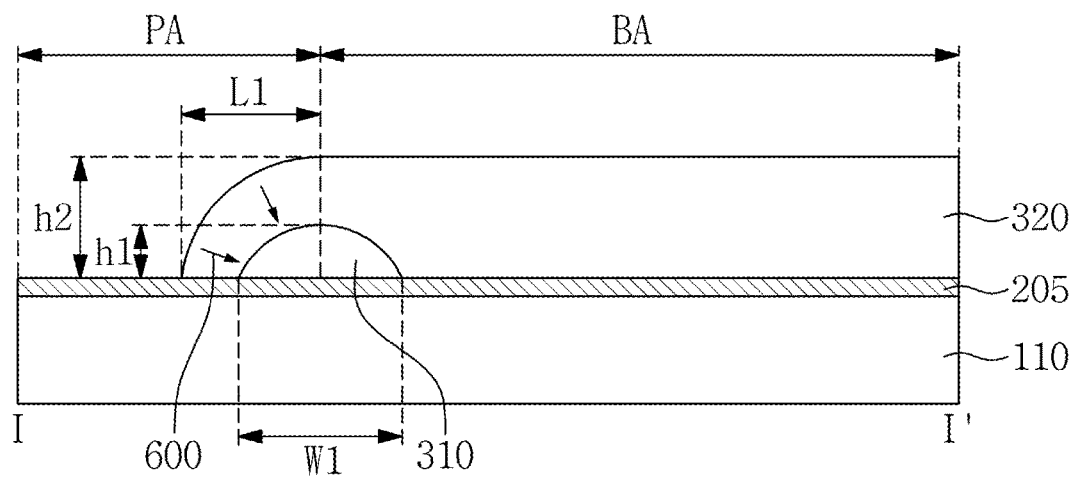
FIG. 4 is a cross-sectional view taken along the line I-I' of FIG. 3.

FIG. 3 is a partial enlarged view illustrating a substrate and a first protective layer in the area "A" of FIG. 1 according to an exemplary embodiment of the present invention. FIG. 4 is a cross-sectional view taken along line the I-I' of FIG. 3.

Referring to FIGS. 3 and 4, the display device according to an exemplary embodiment includes the first and second protective layers 310 and 320 on the substrate 110 and at the bending area BA so as to substantially prevent or reduce breakage and moisture permeation of the signal wiring 205.

The first protective layer 310 is disposed at a boundary portion of the bending area BA. For example, as illustrated in FIGS. 3 and 4, the first protective layer 310 may be disposed at a boundary portion between the bending area BA and the planar area PA.

The second protective layer 320 is disposed on an entire surface of the bending area BA to cover the first protective layer 310. The first and second protective layers 310 and 320 may include a material that may reduce or substantially minimize the force applied to the signal wiring 205 in the bending area BA. In such an exemplary embodiment, a thickness, a Young's modulus, and/or the like of the first and second protective layers 310 and 320 may be considered in order to properly select the material. For example, the first and second protective layers 310 and 320 may include a photo-curable resin. In addition, the first and second protective layers 310 and 320 may include the same or substantially the same material.

For example, a material forming the first protective layer 310, which is a photo-curable resin, is applied on the substrate 110 and at the boundary portion of the bending area BA and then pre-cured. In such an exemplary embodiment, a width (e.g., a maximal width) of the first protective layer 310 is defined as a first width W1, which may be in a range from about 500 μm to about 800 μm. Subsequently, a material forming the second protective layer 320, which is a photo-curable resin, is applied to an entire surface of the bending area BA so as to completely cover the pre-cured material forming the first protective layer 310. In such an exemplary embodiment, the material forming the second protective layer 320 is also applied to the planar area PA and the surrounding area SA that are adjacent to the bending area BA, so that the second protective layer 320 may have a constant or substantially constant height in the bending area BA. Subsequently, the material forming the first protective layer 310 and the material forming the second protective layer 320 are fully cured to form the first and second protective layers 310 and 320.

In such an exemplary embodiment, an attractive force is exerted between the pre-cured material forming the first protective layer 310 and the material forming the second protective layer 320 applied on the pre-cured material forming the first protective layer 310. The attractive force between the material forming the first protective layer 310 and the material forming the second protective layer 320 is greater than an attractive force between the material forming the second protective layer 320 and the substrate 110. Accordingly, an attractive force is exerted during curing in a direction of an arrow 600 to the second protective layer 320, as illustrated in FIG. 4, such that an overlapping area between the first and second protective layers 310 and 320 and the planar area PA may be reduced or substantially minimized.

For example, when an overlap distance on a cross-section between the first and second protective layers 310 and 320 and the planar area PA is defined as a first distance L1, as illustrated in FIG. 4, the first distance L1 may be in a range from about 200 μm to about 400 μm. When the first distance L1 is about 600 μm or more, the display quality may be degraded at an edge area of the display device 100 due to the contact between the second protective layer 320 and the driving circuit unit 200 or the polarizer 270.

In addition, when a thickness of the first protective layer 310, that is, a height (e.g., maximal height) of the first protective layer 310 from the signal wiring 205, is defined as a first height h1, and a thickness of the first and second protective layers 310 and 320, that is, a height of the second protective layer 320 from the signal wiring 205, is defined as a second height h2, the first height h1 is less than the second height h2. In such an exemplary embodiment, the first height h1 may be in a range from about 30 μm to about 70 μm and the second height h2 may be in a range from about 70 μm to about 130 μm.

The display device 100 according to an exemplary embodiment includes the protective layers 310 and 320 formed into a multilayer structure at the boundary portion of the bending area BA, such that an overlap area between the protective layers 310 and 320 and the planar area PA may be reduced or substantially minimized. Accordingly, the material forming the first protective layer 310 and the material forming the second protective layer 320 may be substantially prevented from contacting the driving circuit unit 200 or the polarizer 270 at the planar area PA, thus improving the display quality of the display device 100.

Figure 5:
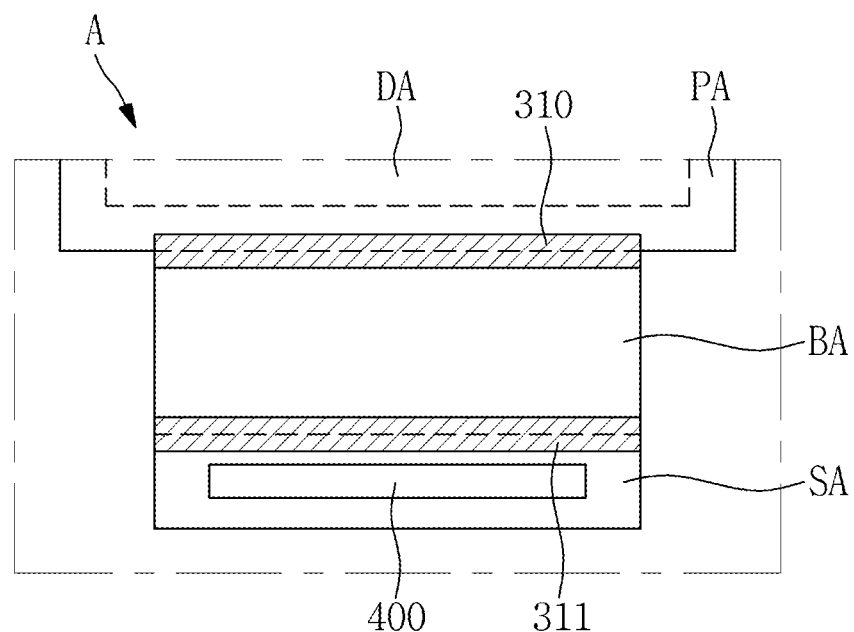
FIG. 5 is a partial enlarged view illustrating a substrate and a first protective layer in the area "A" of FIG. 1 according to an alternative exemplary embodiment of the present invention.

FIG. 5 is a partial enlarged view illustrating a substrate and a first protective layer in the area "A" of FIG. 1 according to an alternative exemplary embodiment of the present invention. The descriptions of a substantially identical configuration as that of an exemplary embodiment of the present invention will be omitted for the sake of convenience.

Referring to FIG. 5, a display device 100 according to an alternative exemplary embodiment includes a pair of first protective layers 310 and 311 and a second protective layer 320 (see, e.g., FIG. 4) on a substrate 110 and at a bending area BA so as to substantially prevent or reduce breakage and moisture permeation of a signal wiring 205.

The pair of first protective layers 310 and 311 are disposed so as to overlap at least a part of a planar area PA and at least a part of a surrounding area SA, respectively. The pair of first protective layers 310 and 311 may include a photo-curable resin. In addition, the pair of first protective layers 310 and 311 may include the same or substantially the same material.

When an overlap distance on a cross-section between the first and second protective layers 311 and 320 and the surrounding area SA is defined as a second distance, the second distance may be in a range from about 200 μm to about 400 μm. When the second distance is about 600 μm or more, defects may occur due to the contact between the second protective layer 320 and a driving IC 400.

The display device 100 according to an alternative exemplary embodiment includes the protective layers 311 and 320 of a multilayer structure at a boundary portion between the bending area BA and the surrounding area SA, such that an overlap area between the protective layers 311 and 320 and the surrounding area SA may be reduced or substantially minimized. Accordingly, the defects that may occur when the materials forming the protective layers 311 and 320 contact the driving IC 400 at the surrounding area SA may be substantially prevented or reduced.

Figure 6:
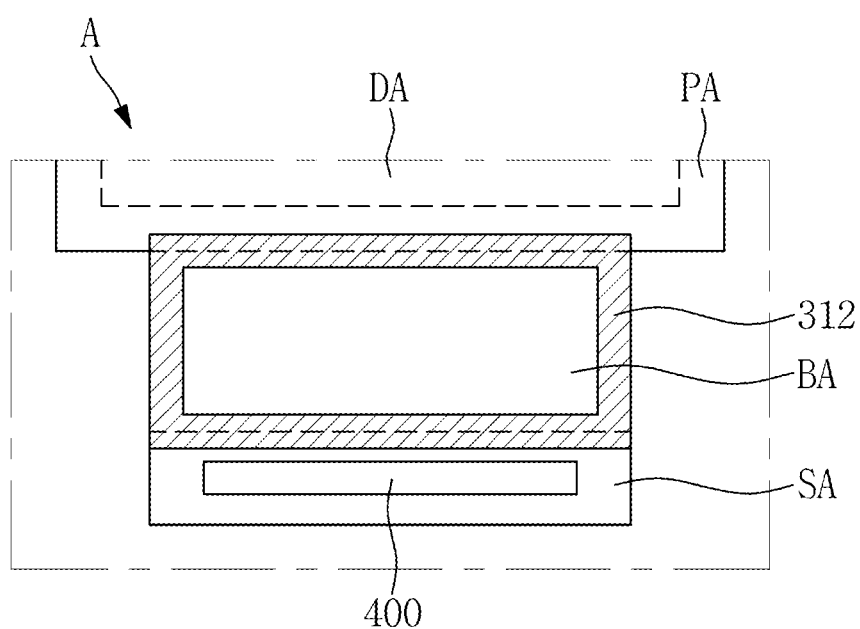
FIG. 6 is a partial enlarged view illustrating a substrate and a first protective layer in the area "A" of FIG. 1 according to another alternative exemplary embodiment of the present invention.

FIG. 6 is a partial enlarged view illustrating a substrate and a first protective layer in the area "A" of FIG. 1 according to another alternative exemplary embodiment of the present invention. The descriptions of a substantially identical configuration as that of an alternative exemplary embodiment of the present invention will be omitted for the sake of convenience.

Referring to FIG. 6, a display device 100 according to another alternative exemplary embodiment includes a first protective layer 312 and a second protective layer 320 (see, e.g., FIG. 4) on a substrate 110 and at a bending area BA so as to substantially prevent or reduce breakage and moisture permeation of a signal wiring 205.

The first protective layer 312 is disposed so as to surround a central portion of the bending area BA. However, exemplary embodiments are not limited thereto and the first protective layer 312 may be disposed only on left and right sides of the bending area BA. The first and second protective layers 312 and 320 may include a photo-curable resin. In addition, the first and second protective layers 312 and 320 may include the same or substantially the same material.

The first protective layer 312 according to another alternative exemplary embodiment may be disposed on the left and right sides of the bending area BA such that the first and second protective layers 312 and 320 may be substantially prevented from being leaked out of the substrate 110. Accordingly, the second protective layer 320 may be formed to have a constant or substantially constant height at the left and right sides of the bending area BA.

Figure 7:
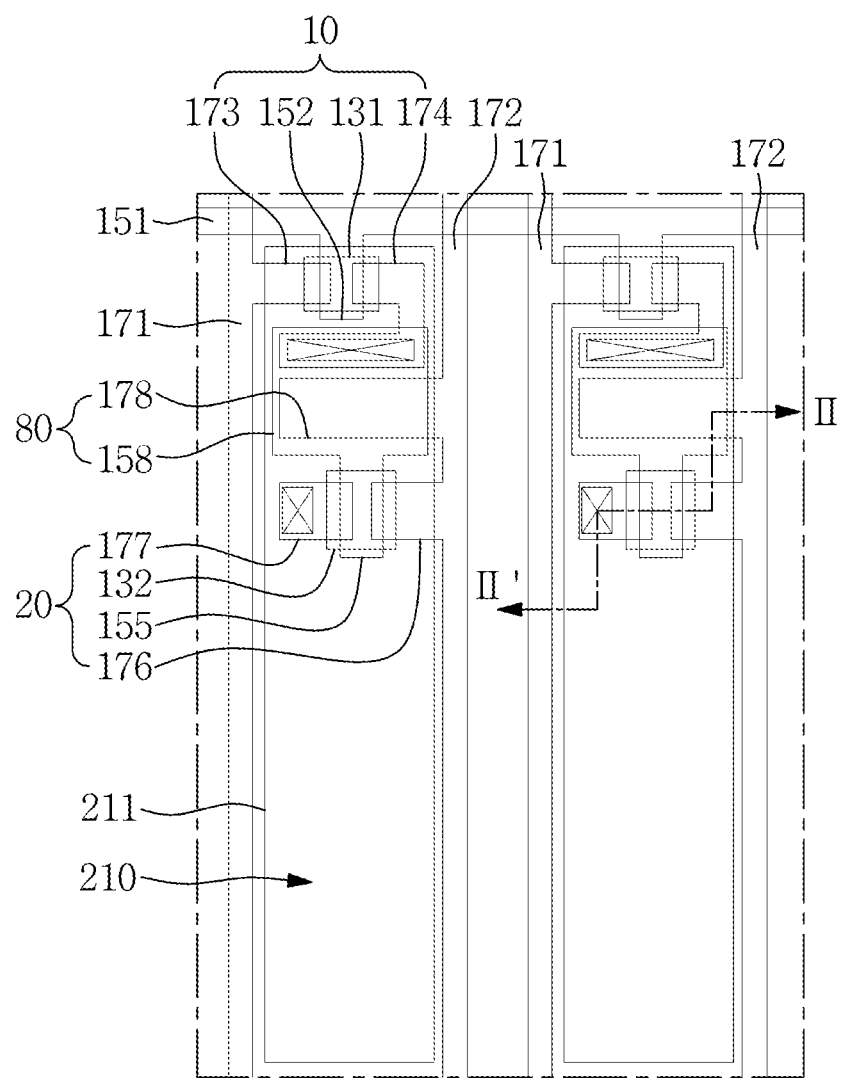
FIG. 7 is a partial enlarged view illustrating a part of a display panel according to an exemplary embodiment of the present invention.
Figure 8:
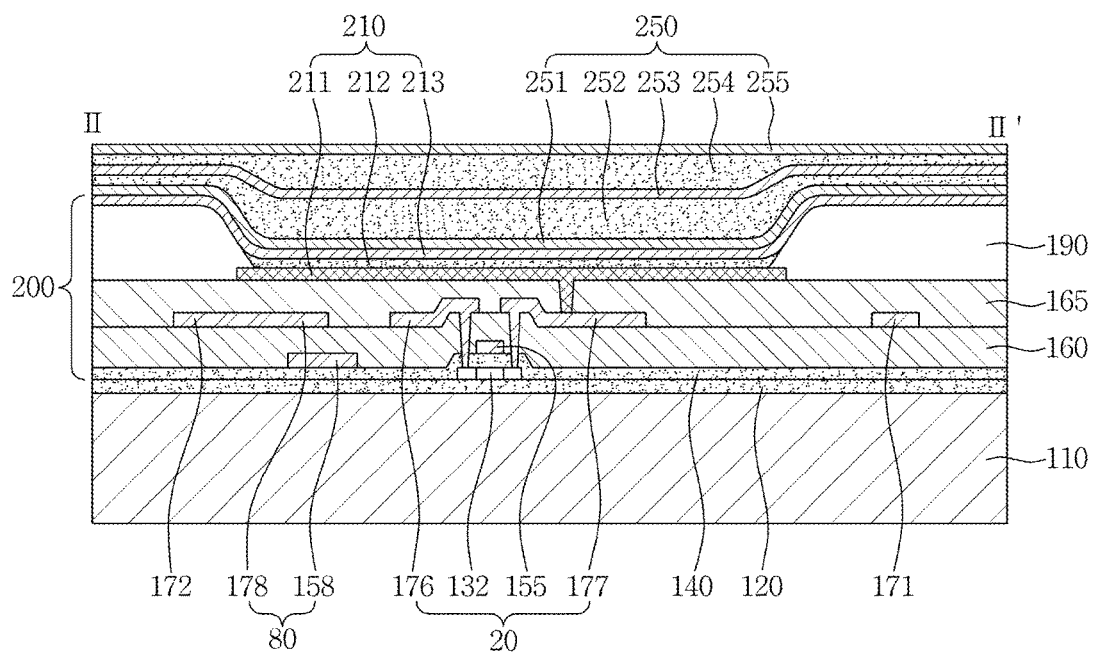
FIG. 8 is a cross-sectional view taken along the line II-II' of FIG. 7.

FIG. 7 is a partial enlarged view illustrating a part of a display panel according to an exemplary embodiment of the present invention. FIG. 8 is a cross-sectional view taken along the line II-II' of FIG. 7.

Referring to FIGS. 7 and 8, the display panel according to an exemplary embodiment includes a plurality of pixels including a switching thin film transistor ("TFT") 10, a driving TFT 20, a capacitor 80 and an OLED 210. The OLED 210 may be widely used in a flexible display device because it may be deposited at a relatively low temperature and have characteristics such as low power consumption, high luminance and the like. Herein, the term "pixel" refers to a smallest unit for displaying a color of an image and the display panel displays an image through the plurality of pixels.

In addition, it is illustrated in the drawings that each pixel includes two TFTs and one capacitor; however, exemplary embodiments are not limited thereto. In some examples, each pixel may include three or more TFTs and two or more capacitors and may have various suitable structures by including additional wirings.

The display panel may include the substrate 110, the gate line 151 on the substrate 110, the data line 171 and a common power line 172 insulated from, and crossing, the gate line 151. In general, each pixel may be defined by the gate line 151, the data line 171, and the common power line 172 as a boundary; however, exemplary embodiments are not limited thereto. The pixels may be defined by a pixel defining layer or a black matrix.

The substrate 110 may include a flexible material. Examples of the flexible material may include plastic materials. For example, the substrate 110 may include kapton, polyethersulphone (PES), polycarbonate (PC), polyimide (PI), polyethyleneterephthalate (PET), polyethylene naphthalate (PEN), polyacrylate (PAR), fiber reinforced plastic (FRP), and/or the like.

In addition, the substrate 110 has a thickness in a range from about 5 μm to about 200 μm. When the substrate 110 has a thickness less than about 5 μm, it is difficult for the substrate 110 to stably support the OLED 210. On the other hand, when the substrate 110 has a thickness of about 200 μm or more, the flexible characteristics of the substrate 110 may be degraded.

A buffer layer 120 is disposed on the substrate 110. The buffer layer 120 is configured to substantially prevent or reduce permeation of undesirable elements and to planarize a surface therebelow, and may include suitable materials for preventing or reducing permeation and/or planarizing. For example, the buffer layer 120 may include a silicon nitride ($SiN_x$) layer, a silicon oxide ($SiO_2$) layer, and/or a silicon oxynitride ($SiO_xN_y$) layer. However, the buffer layer 120 is not invariably necessary and may be omitted based on the kinds of the substrate 110 and process conditions thereof.

A switching semiconductor layer 131 and a driving semiconductor layer 132 are disposed on the buffer layer 120. The switching semiconductor layer 131 and the driving semiconductor layer 132 may include a polycrystalline silicon layer, an amorphous silicon layer, an oxide semiconductor such as indium gallium zinc oxide (IGZO), indium zinc tin oxide (IZTO), and/or the like. For example, in the example in which the driving semiconductor layer 132 includes a polycrystalline silicon layer, the driving semiconductor layer 132 includes a channel area that is not doped with impurities and p+ doped source and drain areas that are formed on opposite sides of the channel area. In such an exemplary embodiment, p-type impurities, such as boron B, may be used as dopant ions and $B_2H_6$ is typically used. Such impurities may vary depending on the kinds of TFTs. The driving TFT 20 according to an exemplary embodiment uses a p-channel metal oxide semiconductor (PMOS) TFT including p-type impurities; however, exemplary embodiments are not limited thereto. In some examples, the driving TFT 20 may use an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include tetraethylorthosilicate (TEOS), silicon nitride ($SiN_x$) and silicon oxide ($SiO_2$), and/or the like. For example, the gate insulating layer 140 may have a double-layer structure where a $SiN_x$ layer having a thickness of about 40 nm and a TEOS layer having a thickness of about 80 nm are sequentially stacked.

A gate wiring including gate electrodes 152 and 155 is disposed on the gate insulating layer 140. The gate wiring further includes the gate line 151, a first capacitor plate 158 and other wirings. In addition, the gate electrodes 152 and 155 are disposed to overlap at least a portion of the semiconductor layers 131 and 132, for example, a channel area thereof. The gate electrodes 152 and 155 serve to prevent or substantially prevent the channel area from being doped with impurities when a source area and a drain area of the semiconductor layers 131 and 132 are doped with impurities during the process of forming the semiconductor layers 131 and 132.

The gate electrodes 152 and 155 and the first capacitor plate 158 are disposed on the same or substantially the same layer and include the same or substantially the same metal material. The gate electrodes 152 and 155 and the first capacitor plate 158 may include molybdenum (Mo), chromium (Cr) and tungsten (W), and/or the like.

An insulating interlayer 160 overlapping the gate electrodes 152 and 155 is disposed on the gate insulating layer 140. The insulating interlayer 160, similar to the gate insulating layer 140, may include or be formed of silicon nitride (SiNx), silicon oxide (SiOx), tetraethoxysilane (TEOS), and/or the like; however, exemplary embodiments are not limited thereto.

A data wiring including source electrodes 173 and 176 and drain electrodes 174 and 177 is disposed on the insulating interlayer 160. The data wiring further includes the data line 171, the common power line 172, a second capacitor plate 178 and other wirings. In addition, the source electrodes 173 and 176 and the drain electrodes 174 and 177 are connected to the source area and the drain area of the semiconductor layers 131 and 132, respectively, through a contact hole defined in the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above embodiments and thus may be modified into various suitable structures that are known to, and may be easily conceived by, those skilled in the pertinent art.

In addition, the capacitor 80 includes the first capacitor plate 158 and the second capacitor plate 178, having the insulating interlayer 160 interposed therebetween.

The switching TFT 10 may function as a switching element configured to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies, to the pixel electrode 211, a driving power that allows a light emitting layer 212 of an OLED 210 in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the OLED 210 through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80 and a current corresponding to the voltage stored in the capacitor 80 flows to the OLED 210 through the driving TFT 20, so that the OLED 210 may emit light.

A planarization layer 165 is disposed to cover the data wiring, for example, the data line 171, the common power line 172, the source electrodes 173 and 176, the drain electrodes 174 and 177, and the second capacitor plate 178, which are patterned into a signal layer.

The planarization layer 165 serves to eliminate or reduce a height difference and planarize a surface therebelow in order to increase luminous efficiency of an OLED 210 to be formed thereon. The planarization layer 165 may include a polyacrylate resin, an epoxy resin, a phenolic resin, a polyamide resin, a polyimide resin, an unsaturated polyester resin, a polyphenylene-based resin (e.g., a polyphenylene ether resin), a polyphenylene sulfide resin, benzocyclobutene (BCB), and/or the like.

The pixel electrode 211 of the OLED 210 is disposed on the planarization layer 165. The pixel electrode 211 is connected to the drain electrode 177 through a contact hole defined in the planarization layer 165.

A pixel defining layer 190, which exposes at least a portion of the pixel electrode 211 to define a pixel area, is disposed on the planarization layer 165. The pixel electrode 211 is disposed corresponding to the pixel area of the pixel defining layer 190. The pixel defining layer 190 may include a resin, such as a polyacrylate resin and a polyimide resin.

The light emitting layer 212 is disposed on the pixel electrode 211 in the pixel area and a common electrode 213 is disposed on the pixel defining layer 190 and the light emitting layer 212. The light emitting layer 212 includes a low molecular weight organic material or a high molecular weight organic material. At least one of a hole injection layer HIL and a hole transporting layer HTL may further be disposed between the pixel electrode 211 and the light emitting layer 212 and at least one of an electron transporting layer ETL and an electron injection layer EIL may further be disposed between the light emitting layer 212 and the common electrode 213.

The pixel electrode 211 and the common electrode 213 may be formed as one of a transmissive electrode, a transflective electrode, and a reflective electrode.

A transparent conductive oxide ("TCO") may be used to form a transmissive electrode. Examples of TCO may include indium tin oxide (ITO), indium zinc oxide (IZO), zinc oxide (ZnO), or $In_2O_3$ (Indium Oxide).

A metal, for example, magnesium (Mg), silver (Ag), gold (Au), calcium (Ca), lithium (Li), chromium (Cr), aluminum (Al) and copper (Cu), an alloy thereof, and/or the like may be used to form a transflective electrode and a reflective electrode. In such an exemplary embodiment, whether an electrode is a transflective type or a reflective type depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the other hand, as the thickness of the transflective electrode increases, light transmittance decreases.

In addition, the transflective electrode and the reflective electrode may have a multilayer structure, which includes a metal layer including a metal or a metal alloy and a TCO layer stacked on the metal layer.

The encapsulation layer 250 is disposed on the common electrode 213. The encapsulation layer 250 includes one or more inorganic layers 251, 253, and 255, and one or more organic layers 252 and 254. In addition, the encapsulation layer 250 may have a structure in which the inorganic layers 251, 253, and 255 and the organic layers 252 and 254 are alternately stacked. In such an exemplary embodiment, an inorganic layer 251 is disposed at a lowermost portion. That is, the inorganic layer 251 is disposed most adjacent to the OLED 210.

In an exemplary embodiment, the encapsulation layer 250 includes three inorganic layers 251, 253, and 255 and two organic layers 252 and 254; however, exemplary embodiments are not limited thereto.

Each of the inorganic layers 251, 253, and 255 may include $Al_2O_3$, $TiO_2$, $ZrO$, $SiO_2$, AlON, AlN, SiON, $Si_3N_4$, ZnO, $Ta_2O_5$, and/or the like. The inorganic layers 251, 253, and 255 may be formed through methods such as a chemical vapor deposition (CVD) method or an atomic layer deposition (ALD) method. However, exemplary embodiments are not limited thereto and the inorganic layers 251, 253, and 255 may be formed using various suitable methods known to those skilled in the art.

The organic layers 252 and 254 may include a polymer-based material. Examples of the polymer-based material may include an acrylic resin, an epoxy resin, polyimide and polyethylene. In addition, the organic layers 252 and 254 are formed through a thermal deposition process. The thermal deposition process for forming the organic layers 252 and 254 may be performed in a temperature range that may not damage the OLED 210. However, exemplary embodiments are not limited thereto and the organic layers 252 and 254 may be formed using various suitable methods known to those skilled in the pertinent art.

The inorganic layers 251, 253, and 255, which have a high density of thin film may substantially prevent or efficiently reduce infiltration of, mostly, moisture or oxygen. Permeation of moisture and oxygen into the OLED 210 may be largely prevented by the inorganic layers 251, 253 and 255.

The encapsulation layer 250 may have a thickness of about 10 μm or less. Accordingly, an overall thickness of the display panel may become significantly thin. By applying the encapsulation layer 250 in such a manner, the flexible characteristics of the display panel may be substantially maximized.

The flexible display device according to one or more exemplary embodiments may substantially prevent or reduce deformation of a metal plate, which is provided to shield heat dissipation and electromagnetic waves, even though the bending operation is repeated, by forming the metal plate with a high strength material.

In addition, by forming a preset or predetermined pattern at the bending portion of the high-strength metal plate, the stress of the metal plate may be distributed.

As set forth hereinabove, according to one or more exemplary embodiments, the display quality of the display device may be improved by including the protective layer of a multilayer structure at a boundary portion of the bending area.

While the present invention has been illustrated and described with reference to the exemplary embodiments thereof, it will be apparent to those of ordinary skill in the art that various suitable changes in form and detail may be formed thereto without departing from the spirit and scope of the present invention as defined by the following claims and equivalents thereof.

What is claimed is:

1. A display device comprising:
    a substrate having a first planar portion, a second planar portion overlapping with the first planar portion in a plan view and a bending portion extending from the first planar portion to the second planar portion;
    an organic light emitting diode on the substrate;
    a support film on a rear surface of the substrate and supporting the first planar portion;
    a first protective layer on a front surface of the substrate and overlapping with an edge of the support film in the plan view; and
    a second protective layer covering the first protective layer and the bending portion.

2. The display device as claimed in claim 1, wherein at least a part of the first protective layer and at least a part of the second protective layer are on the first planar portion.

3. The display device as claimed in claim 1, wherein at least a part of the second protective layer is on the second planar portion.

4. The display device as claimed in claim 1, wherein the first protective layer and the second protective layer comprise a photo-curable resin.

5. The display device as claimed in claim 1, wherein the first protective layer extends along the edge of the support film and has a width of 500 μm to 800 μm.

6. The display device as claimed in claim 1, wherein the first protective layer has a thickness of 30 μm to 70 μm.

7. The display device as claimed in claim 6, wherein the first protective layer and the second protective layer have a thickness of 70 μm to 130 μm at an overlap area between the first protective layer and the second protective layer.

8. The display device as claimed in claim 1, wherein the first protective layer surrounds a center of the bending portion.

9. The display device as claimed in claim 1, further comprising:
    a gate line on the planar portion;
    a data line on the planar portion and crossing the gate line; and
    a thin film transistor on the planar portion and connected to the gate line and the data line.

10. The display device as claimed in claim 9, further comprising a driving integrated circuit on the second planar portion, and
    the bending portion comprises a signal line connecting the gate line or the data line to the driving integrated circuit.

11. The display device as claimed in claim 1, wherein the support film comprises a polyethyleneterephthalate (PET) film.

12. The display device as claimed in claim 1, wherein a peak height of the first protective layer from the substrate is less than a peak height of the second protective layer from the substrate.

13. The display device as claimed in claim 1, wherein the second protective layer overlaps the first protective layer at a point where the first protective layer has a maximum thickness.

14. The display device as claimed in claim 1, further comprising:
    an auxiliary member between the first and second planar portion; and
    an adhesive layer between the first planar portion and the auxiliary member and between the second planar portion and the auxiliary member.

15. The display device as claimed in claim 14, wherein the first protective layer overlaps with an edge of the auxiliary member in the plan view.

16. The display device as claimed in claim 14, further comprising a polarizer on the organic light emitting diode,
    wherein a distance from a boundary between the first planar portion and the bending portion to the polarizer in the plan view is longer than a distance from the boundary to an edge of the auxiliary member in the plan view.

17. The display device as claimed in claim 14, wherein the adhesive layer is located between the bending portion and an edge of the auxiliary member and attaches the bending portion to the edge of the auxiliary member.

18. The display device as claimed in claim 17, wherein the first protective layer overlaps with the adhesive layer located between the bending portion and an edge of the auxiliary member.

19. The display device as claimed in claim 17, further comprising a polarizer on the organic light emitting diode, and
    wherein a distance from a boundary between the first planar portion and the bending portion to the polarizer in the plan view is longer that a maximum distance from the boundary to the adhesive layer located between the bending portion and an edge of the auxiliary member in the plan view.

20. The display device as claimed in claim 1, further comprising a polarizer on the organic light emitting diode, and wherein the first protective layer and the second protective layer are spaced from the polarizer.

* * * * *